United States Patent [19]

Kanai

[11] Patent Number: 4,835,684
[45] Date of Patent: May 30, 1989

[54] MICROCOMPUTER CAPABLE OF TRANSFERRING DATA FROM ONE LOCATION TO ANOTHER WITHIN A MEMORY WITHOUT AN INTERMEDIARY DATA BUS

[75] Inventor: Tetsuro Kanai, Tokyo, Japan
[73] Assignee: NEC Corporation, Tokyo, Japan
[21] Appl. No.: 898,548
[22] Filed: Aug. 21, 1986
[30] Foreign Application Priority Data

Aug. 21, 1985 [JP] Japan ............................... 60-184724

[51] Int. Cl.⁴ .............................................. G06F 12/00
[52] U.S. Cl. ............................... 364/200; 365/189.03; 365/230.03; 364/245; 364/246.2
[58] Field of Search ... 364/200 MS File, 900 MS File, 364/200, 900, 189

[56] References Cited

U.S. PATENT DOCUMENTS

| | | | |
|---|---|---|---|
| 4,511,962 | 4/1985 | Machida et al. | 364/200 |
| 4,541,075 | 9/1985 | Dill et al. | 365/189 |
| 4,740,922 | 4/1988 | Ogawa | 365/189 |

Primary Examiner—Thomas M. Heckler
Assistant Examiner—Rebecca L. Rudolph
Attorney, Agent, or Firm—Foley & Lardner, Schwartz, Jeffery, Schwaab, Mack, Blumenthal & Evans

[57] ABSTRACT

A microcomputer comprises a central processing unit, an internal data bus coupled to the central unit, a read-write memory having a plurality of memory locations and adapted such that data can be both read from and written into a memory location designated by an address given by the central processing unit, a register directly coupled to the memory and controlled by the central processing unit for holding the data read out of the memory without transferring the read out data to the internal data bus, and a read/write circuit connected between the register, the internal data bus and the memory and controlled by the central processing unit for transferring the data held in the register to the internal data bus and then to the memory from the internal data bus.

11 Claims, 7 Drawing Sheets

MICROCOMPUTER CAPABLE OF TRANSFERRING DATA FROM ONE LOCATION TO ANOTHER WITHIN A MEMORY WITHOUT AN INTERMEDIARY DATA BUS

BACKGROUND OF THE INVENTION

1. Field of the Invention

The present invention relates to microcomputers, having a central processing unit (hereinafter referred to as "CPU"), a random access memory (hereinafter referred to as "RAM") and an internal data bus through which various data is transferred between the CPU and the RAM. More specifically, the present invention relates to such microcomputers capable of reading a data out of a memory location of the RAM designated by a RAM address signal supplied by the CPU and writing the read out data to a different memory location of the RAM designated by another RAM address signal similarly supplied by the CPU.

2. Description of the related art

Conventionally, typical microcomputers capable of transferring data between different memory locations include a CPU, a data bus coupled to the CPU, and a RAM receiving an address signal from the CPU. A first read/write unit is coupled between the RAM and the data bus. The CPU supplies a first read signal and a first write signal to the first read/write unit, so as to control the operation of the first read/write unit.

The microcomputer further includes a register to store a data temporarily, and a second read/write unit coupled between the register and the data bus. The CPU supplies a second read signal and a second write signal to the second read/write unit.

A microcomputer constructed as mentioned above operates in the following manner.

The CPU supplies a read address signal to the RAM. The first read/write unit reads a data out of the RAM at the address designated by the above read address signal and then outputs the data onto the data bus in response to the first read signal. The second read/write unit writes the data on the data bus to the register in response to the second write signal. Such a bus cycle is called a RAM read cycle.

After the RAM read cycle, the CPU supplies a write address signal to the RAM. The second read/write unit reads the data stored in the register and outputs the data onto the data bus in response to the second read signal. The first read/write unit writes the data on the data bus to the RAM at the address designated by the write address signal. Such a bus cycle is called a RAM write cycle.

Such a data transfer within the same RAM is required in the field of various digital signal processings including an image processing, a voice processing, etc.

In conventional microcomputers, a RAM disposed on a microcomputer chip with a CPU are functions:

(1) to store a data to be treated in the CPU and a data treated in the CPU, and (2) to store a data inputted from and a data to be outputted to the outside of the microcomputer.

An internal data bus must be, therefore, necessarily used every time any instructions to access the RAM such as a memory read instruction and a memory write instruction are executed. Bus cycle is scheduled in such a manner that the internal data bus may be assigned to reading a data out of or writing a data to the RAM in case of executing a RAM access instruction. Namely, it is necessary to control the internal bus so that during the period the data is transferred between two units through the internal data bus the other units are not allowed to access the internal data bus. To make the above control simple, a RAM is coupled directly to an internal bus similarly with other units of a CPU.

With the conventional microcomputer, a data at the address designated by a read address signal is written at the different address designated by a write address signal by means of the operation as described above. Namely, in case of transferring a data at the address A of the RAM to the address B inside the same RAM, a read instruction for a data at the address A and a write instruction for writing the data at the address B have to be executed. Since these read and write instructions are independent of each other, it is required to store the data which is read out of the address A and outputted onto the data bus by a read instruction somewhere appropriate until the write instruction is sequentially executed. This is why a register is provided being coupled to the data bus. The data read out of the address A is temporarily stored in the register when the read instruction is executed and the stored data is written to the address B through the data bus when the write instruction is executed.

In the conventional microcomputer as mentioned above, a register is coupled to a RAM through a data bus. The data bus is, therefore, used during both a RAM read cycle and a RAM write cycle in case of transferring a data from an address to a different address of the same RAM. Consequently, any instructions which require to use a data bus may not be executed during these two bus cycles.

SUMMARY OF THE INVENTION

Accordingly, it is an object of the present invention to provide a microcomputer which has dissolved the above mentioned drawbacks of the conventional microcomputer.

another object of the present invention is to provide a microcomputer which does not occupy the internal data bus during two bus cycles such as a RAM read cycle and a RAM write cycle in case of transferring a data in the same RAM.

Still another object of the present invention is to provide a microcomputer free from a fall of the operation speed as well as in case of simply transferring a data to other units through the internal data bus.

The above and other objects of the present invention are achieved in accordance with one aspect of the present invention by means for transferring data from a memory location to another memory location of a read/write memory via a data bus, comprising a circuit directly coupled to the memory for holding the data read out of the memory by a read instruction, and a read/write circuit connected between the data hold circuit, the data bus and the memory, the read/write circuit being operative to read out the data held in the data hold circuit to the data bus and then to write the memory with the data on the data bus by a write instruction.

In a specific embodiment, the memory is a random access memory, and the data transfer means further includes a central processing unit adapted to supply a read address signal to the random access memory for executing a memory read instructions and a first write signal to the data hold circuit so that the data at a memory location in the random access memory designated by the read address signal is written into the data hold circuit without using the internal bus. The central processing unit then operates to supply a read signal to the read/write circuit so that the data held in the data hold circuit is transferred through the read/write circuit to the internal data bus. Thereafter, the central processing unit supplies a write address signal to the random access memory for executing a memory write instruction and a second write signal to the read/write circuit while the read signal is supplied to the read/write circuit, so that the data on the data bus is written into a memory location designated by the write address signal through the read/write circuit.

In another embodiment, the data transfer means further includes a multiplexor having an input connected to the memory, a first output connected to the data hold circuit, and a second output connected to the read/write circuit, the multiplexor being controlled so that data read out from the memory is supplied to the data hold circuit when the data should be transferred from a memory location of the memory to another memory location of the same memory.

According to another aspect of the present invention, there is provided means for transferring data from a memory location to another memory location of a read/write memory, comprising a register directly coupled to the memory for holding the data read out of the memory without using an internal data bus, and a read/write circuit connected between the register and the memory, and operative to read out the data held in the register and then to write the read out data directly to the memory.

Specifically, the memory includes a plurality of memory blocks having a common input/output line, and the register includes a corresponding number of unitary register having an input connected to the common input/output line of a corresponding memory block. Further, the read/write circuit includes a corresponding number of unitary read/write circuits each having an input connected to a corresponding unitary register, a first output internally and ceaselessly coupled to the input of the same unitary read/write circuit and connected to the common input/output line of a corresponding memory block, and a second output connected to an internal data bus and internally connected to the input of the same unitary read/write through a transfer gate which is turned on when data should be transferred from the memory to the internal data bus, so that data can be transferred from one memory location of a given memory block to another memory location of the same memory block without the intermediary of the internal data bus while maintaining the transfer gate in a turned-off condition.

According to a third embodiment of the present invention, there is provided a microcomputer comprising a central processing unit, an internal data bus coupled to the central processing unit, a read-write memory having a plurality of memory locations and adapted such that data can be both read from and written into a memory location designated by an address given by the central processing unit, a register directly coupled to the memory and controlled by the central processing unit for holding the data read out of the memory, and a read/write circuit connected between the register, the internal data bus and the memory and controlled by the central processing unit for reading out the data held in the register to the internal data bus and then to write the memory with the data on the internal data bus.

In one embodiment of the microcomputer, the memory is a random access memory, and the central processing unit is adapted to supply a read address signal to the random access memory and a first write signal to the register so that the data at a memory location in the random access memory designated by the read address signal is written into the register. The central processing unit then operates to supply a read signal to the read/write circuit so that the data held in the register is read out by the read/write circuit and outputted to the internal data bus. The central processing unit supplies a write address signal to the random access memory and a second write signal to the read/write circuit while the read signal is supplied to the read/write circuit, so that the data on the internal data bus is written into a memory location designated signal by the write address by the action of the read/write circuit.

Preferably, the memory includes a plurality of memory blocks having a common input/output line, and the register includes a corresponding number of unitary register having an input connected to the common input/output line of a corresponding memory block. Further, the read/write circuit includes a corresponding number of unitary read/write circuit each having an input connected to a corresponding unitary register, a first output internally and ceaselessly coupled to the input of the same unitary read/write circuit and connected to the common input/output line of a corresponding memory block, and a second output connected to the internal data bus and internally connected to the input of the same unitary read/write through a transfer gate which is brought into an on condition in response to the read signal from the central processing unit, so that data can be transferred from one memory location of a given memory block to another memory location of the same memory block without the intermediary of the internal data bus while maintaining the transfer gate in an off condition.

More specifically, each of the unitary registers includes a first inverter having an input connected to the common input/output line of the associated memory block through a second transfer gate transistor whose gate is connected to receive the first write signal from the central processing unit. The first inverter has an output connected to the corresponding unitary read/write circuit and an input second inverter. Further, a feedback transistor is connected between an output of the second inverter and the input of the first inverter and has a gate connected to receive through another inverter the first write signal from the central processing unit, whereby the data is retained in the unitary register immediately after the data is inputted to the unitary register in response to the first write signal.

In addition, each of the unitary read/write circuits further includes a third inverter having an input connected to the output of the first inverter of the corresponding unitary register and an output through the first mentioned transfer gate to the internal data bus, and a write buffer connected at its input to the output of the third inverter and at its output to the common input/output line of the associated memory block, the write buffer being adapted to be put in an operative condition in response to the second writing signal from the central processing unit.

The above and other objects, features and advantages of the present invention will be apparent from the following description of preferred embodiments of the invention with reference to the accompanying drawings.

DESCRIPTION OF THE PREFERRED EMBODIMENTS

Figure 1:
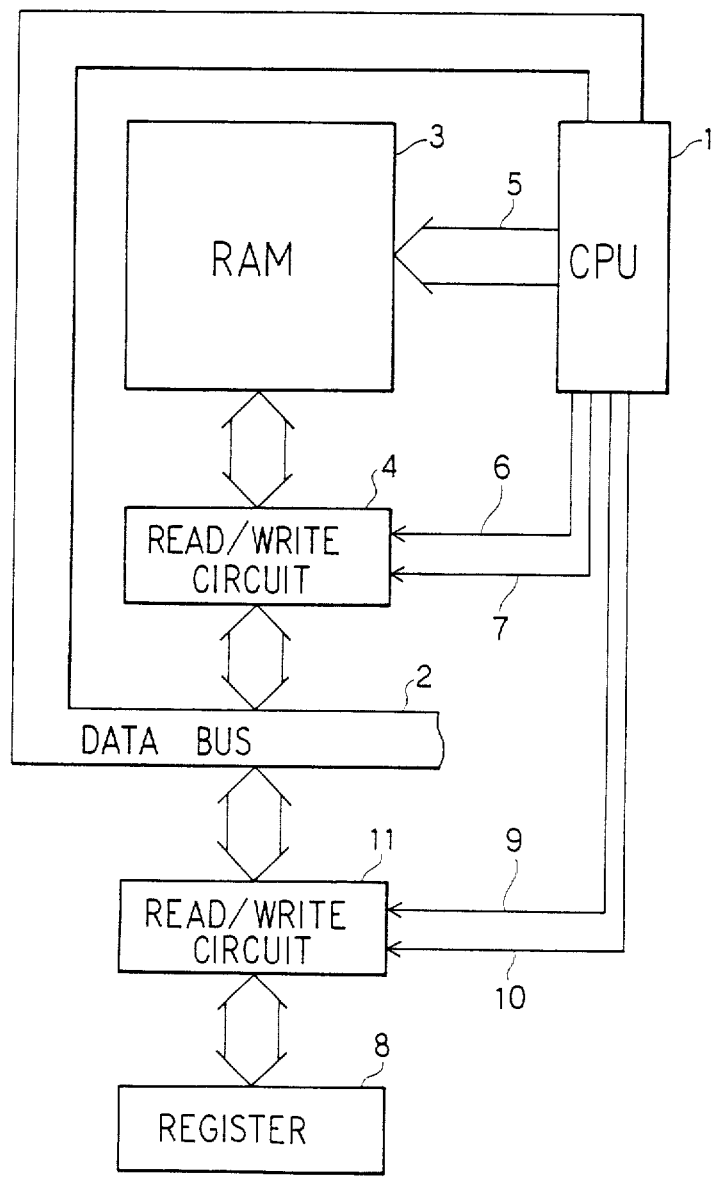
FIG. 1 is a block diagram of a conventional microcomputer.

Referring to FIG. 1, there is shown a block diagram of a conventional microcomputer.

The microcomputer shown in the figure includes a CPU 1, a data bus 2 coupled to the CPU 1, and a RAM 3 receiving an address signal through an address bus 5 from the CPU 1. A first read/write unit 4 is coupled between the RAM 3 and the data bus 2. The CPU 1 supplies a first read signal 6 and a first write signal 7 to the first read/write unit 4.

The microcomputer further includes a register 8 to store a data temporarily. A second read/write unit 11 is coupled between the register 8 and the data bus 2. The CPU 1 also supplies a second read signal 9 and a second write signal 10 to the second read/write unit 11.

Figure 2:
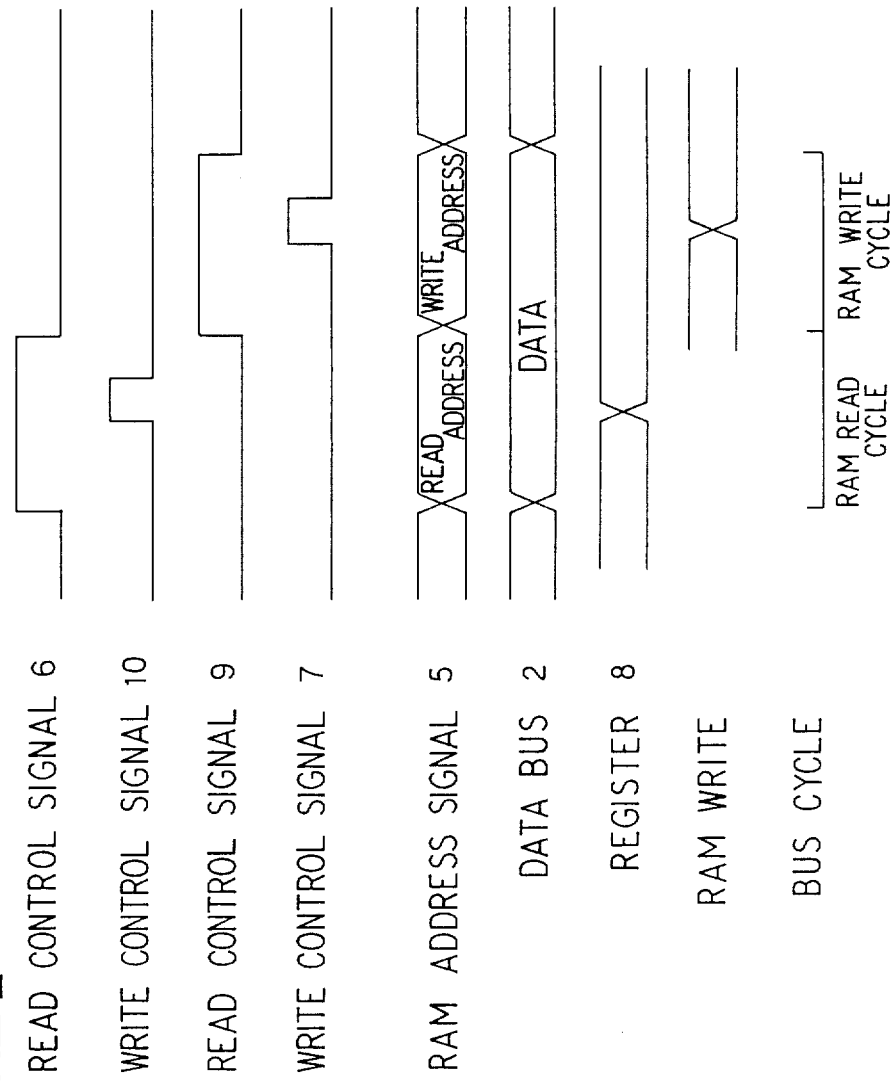
FIG. 2 is a timing chart illustrating the operation of the conventional microcomputer shown in FIG. 1.

Explanation will be made on the operation of the conventional microcomputer constructed as mentioned above, with reference to a timing chart shown in FIG. 2.

The CPU 1 supplies a read address signal through the address bus 5 during a RAM read cycle. The first read/write unit 4 reads a data out of the RAM 3 at the address designated by the read address signal through the address bus 5 and outputs the data onto the data bus 2 in response to the first read signal 6. The second read/write unit 11 writes the data on the data bus to the register 8 in response to the second write signal 10.

The CPU 1 sequentially supplies a write address signal through the address bus 5 to the RAM 3 during a RAM write cycle. The second read/write unit 11 reads the data stored in the register 8 and outputs the data onto the data bus 2 in response to the second read signal 9. The first read/write unit 4 writes the data on the data bus 2 to the RAM 3 at the address designated by the write address signal through the address bus 5 in response to the second write signal 7.

In the conventional microcomputer as mentioned above, a register is coupled to a RAM through a data bus. The data bus is, therefore, occupied during both a RAM read cycle and a RAM write cycle in case of transferring a data from an address to a different address inside the same RAM. Consequently, any instructions which require to use a data bus are not available during these two cycles.

Figure 3:
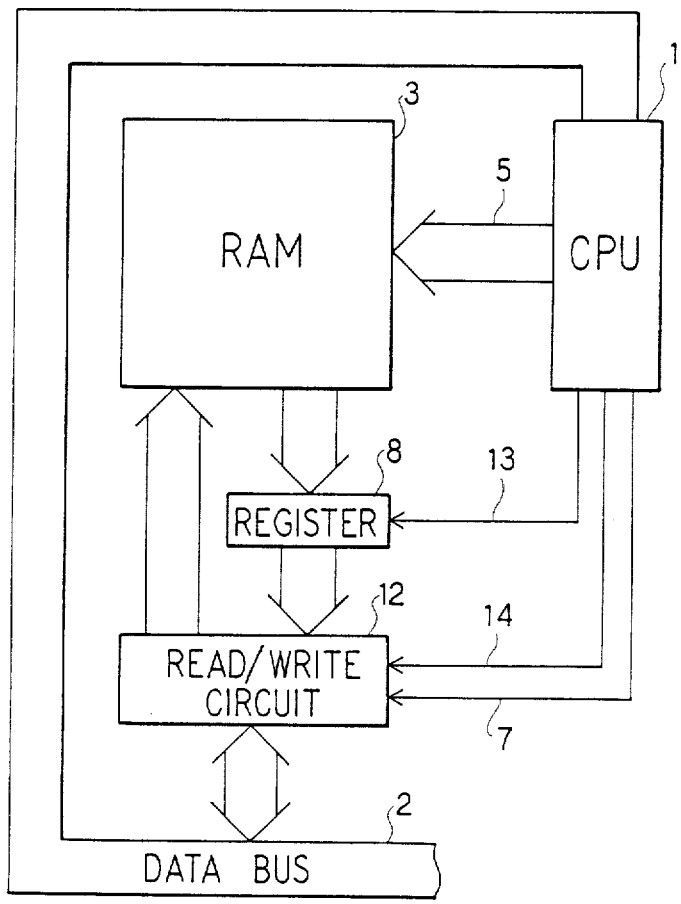
FIG. 3 is a block diagram of a microcomputer in accordance with the present invention.

Turning to FIG. 3, there is shown a microcomputer in accordance with the present invention, in which elements similar to those shown in FIG. 1 are given the same Reference Numerals.

The microcomputer shown in FIG. 3 comprises a CPU 1, a data bus 2 which is coupled to the CPU 1, and a RAM 3 receiving an address signal through the address bus 5 from the CPU 1. A register 8 is coupled to the RAM 3 having its input connected to the output of the RAM 3. The CPU 1 supplies a first write signal 13 to the register 8. A read/write unit 12 is coupled between the data bus 2, the register 8 and the RAM 3. The CPU 1 supplies a read signal 14 and a second write signal 7 to the read/write unit 12.

Figure 4:
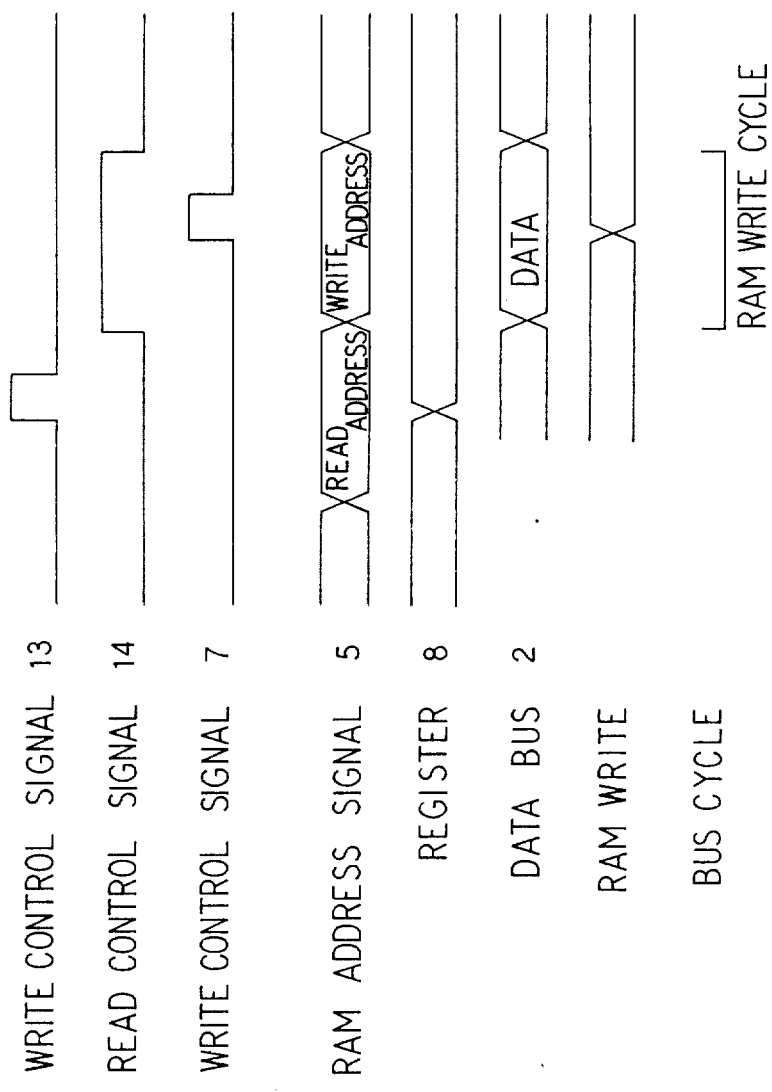
FIG. 4 is a timing chart illustrating the operation of the microcomputer shown in FIG. 3.

Explanation will be made on the operation of the microcomputer constructed as mentioned above, with reference to a timing chart shown in FIG. 4.

While the CPU 1 supplies a read address signal through the address bus 5, the register 8 stores a data read out of the RAM at the address designated by the read address signal through the address bus 5 in response to the first write signal 13 from the CPU 1.

The CPU 1 sequentially supplies a write address signal 5 to the RAM 3. The read/write unit 12 responds to the read signal 14 to read the data stored in the register 8 and output the data onto the data bus 2. In response to the second write signal 7 from the CPU 1, the same read/write unit 12 writes the data on the data bus 2 to the RAM at the address designated by the write address signal through the address bus 5.

In the microcomputer in accordance with the present invention, a data read out of the RAM 3 is not outputted directly onto the data bus 2 but is stored in the register 8 provided between the internal data bus 2 and the RAM 3. The data stored in the register 8 is outputted and written into the RAM 3 under a write instruction. Thus, the internal data bus 2 is not used under the read instruction. Namely, the internal bus 2 is available when the data read out of the RAM 3 is stored in the register 8. As a result, the bus access time of the internal bus is shortened.

Any instructions which require to use the internal data bus 2 and do not require to access to the RAM 3 can be executed when the read instruction is executed. Such instructions are, for example, an instruction for setting the output of an arithmetic logic unit (ALU) to a peripheral control unit, an instruction for loading a data which s inputted to a peripheral controller to a register excluding a RAM, an instruction for inputting an address signal for accessing the ROM from the outside of the microcomputer and setting the signal to an address register and so on.

Figure 5:
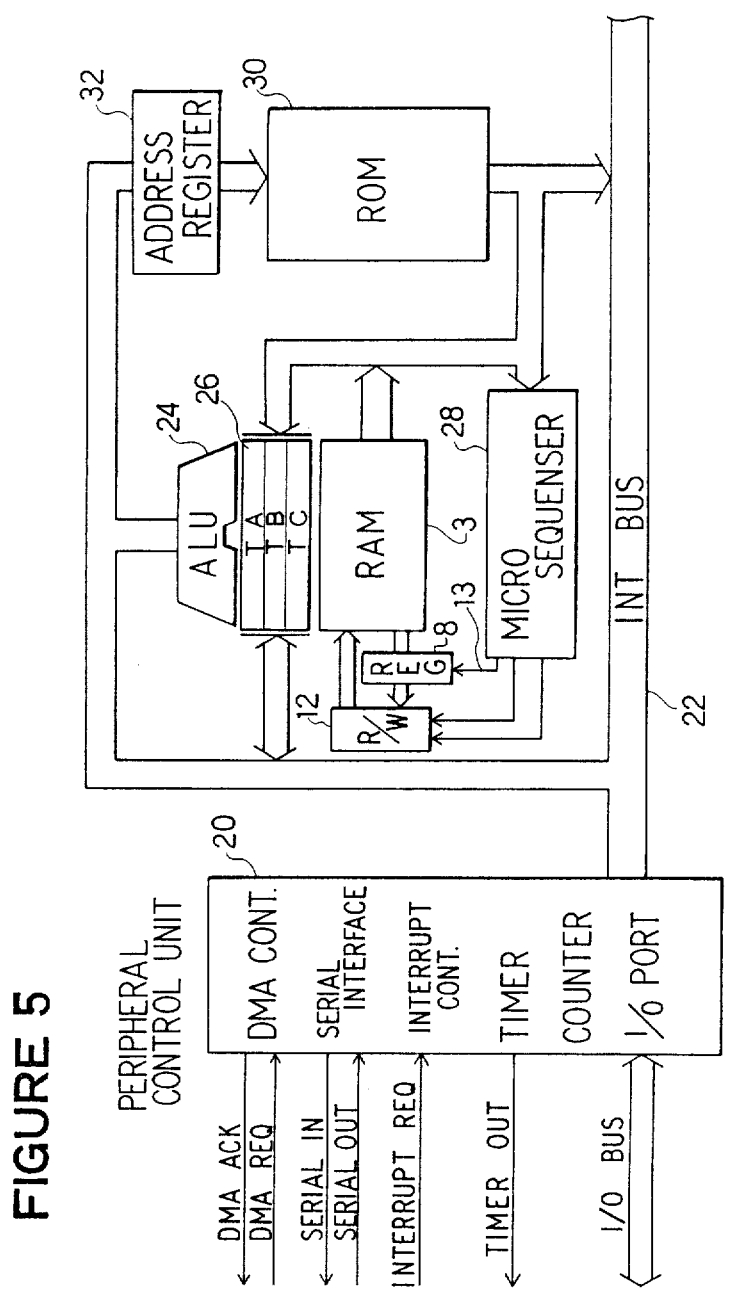
FIG. 5 is a more specific block diagram of a microcomputer shown in FIG. 3.

Specifically, the microcomputer of FIG. 3 comprises a peripheral control unit 20 as shown in FIG. 5 which internally containing a direct memory access (DMA) controller receiving a DMA request signal and outputting a DMA acknowledge signal; a serial interface having a serial input and a serial output; and interrupt controller receiving an interrupt request signal, a timer having a time-out signal and an input/output port connected to an external input/output bus. This peripheral control unit 20 is coupled to an internal bus 22 including the data bus 2 and the address bus 5 shown in FIG. 3, and a control bus. The CPU 1 is mainly constituted of an arithmetic and logic unit (ALU) 24 having an output coupled to the internal bus 22 and a pair of inputs coupled to temporary registers 26 which are also coupled to the internal bus 22. The CPU 1 also includes a microprogram sequencer 28 coupled to the internal bus 22 and adapted to generate the first write signal 13 to the register 13 and the second write signal 7 and the read signal 14 to the read/write circuit 12. Further, the microcomputer includes a read only memory (ROM) 30 having an output coupled to the internal bus and associated with an address register 32 for supplying an address to the ROM 30.

Figure 6:
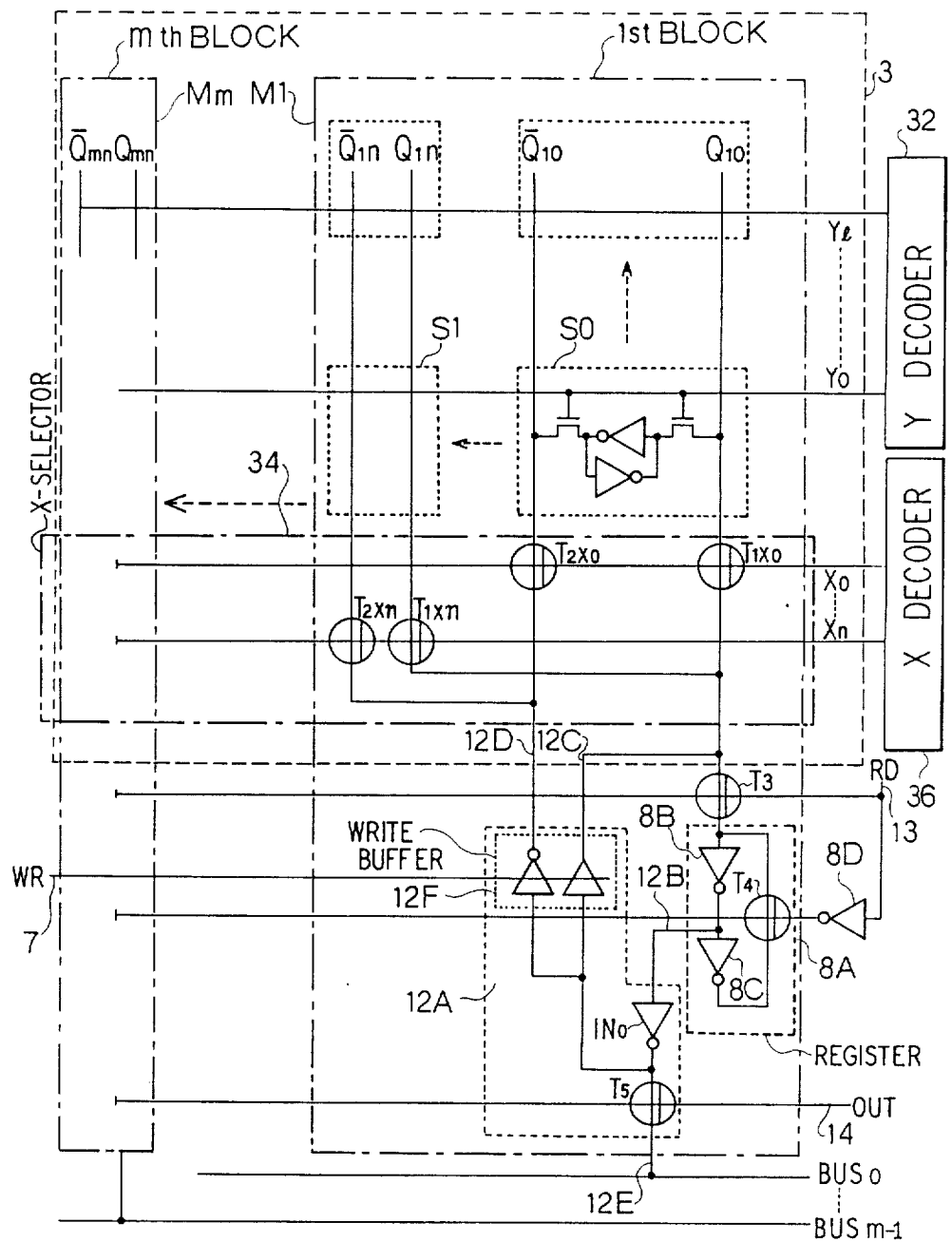
FIG. 6 is a circuit diagram of the RAM, the register and the read/write circuit incorporated in the microcomputer shown in FIG. 5.

Turning to FIG. 6, there is shown the structure of the RAM 3 and the associated circuits 8 and 12. The RAM 3 includes a plurality of memory blocks $M_1-M_m$. Each memory block includes a plurality of word lines $Y_0-Y_1$ selectively driven by a Y-decoder 32 receiving a portion of the address 5, a plurality of pairs of data lines $Q_{i0}$ and $Q_{i0} \ldots Q_{in}$, $\overline{Q}_{in}$ (i=1 to m) intersecting the word lines and connected through an Xselector 34 to a pair of common input/output lines 12C and 12b. This x-selector 34 includes a plurality of pairs of transfer gate transistors $T_1 \times 0$ and $T_2 \times 0 \ldots T_1 \times n$ and $T_{2 \times n}$, each pair of which connected between a corresponding pair of data lines $Q_{ij}$ and $\overline{Q}_{ij}$ (i=1 to m, j=1 to n) and a pair of common input/output lines 12C and 12D. Each memory block further includes a number of memory cells $S_0$, $S_1 \ldots$ respectively located at intersections between the word lines and the data lines so as to form a memory cell matrix, each of the memory cells being connected between one of the word lines $Y_K$ (K=0 to 1) and one pair of the data lines $Q_{ij}$ and $\overline{Q}_{ij}$ (i=1 to m and j=1 to n).

Each memory block is associated with a unitary register 8A having an input unitary read/write circuit 12A having an input 12B connected to the corresponding unitary register 8A, a pair of first outputs connected to the common input/output lines 12C and 12D of a corresponding memory block, and a second output 12E connected to a internal data bus BUS 0. Each of the unitary registers 8A includes a first inverter 8B having an input connected to the common input/output line 12C of the associated memory block through a second transfer gate transistor $T_3$ whose gate is connected to receive the first write signal 13 from the microprogram sequencer 28. The first inverter 8B has an output connected to the corresponding unitary read/write circuit 12A and a second inverter 8C. Further, a feedback transistor $T_4$ is connected between an output of the second inverter 8C and the input of the first inverter 8B and has a gate connected to receive through another inverter 8D the first write signal 13 from the microprogram sequencer 28. With this construction, the data is retained in the unitary register immediately after the data is inputted to the unitary register in response to the first write signal 13.

In addition, each of the unitary read/write circuits 12A includes a inverter 1N having an input 12B connected to the output of the first inverter 8B and an output to the internal bus BUS 0 through a transfer gate transistor $T_5$ whose gate connected to receive the read signal 14 from the microprogram sequencer 28. Further, a pair of tri-state type write buffers 12F are connected at their input to the output of the inverter 1N and at their outputs to the common input/output lines 12C and 12D of the associated memory block. These write buffers are adapted to be put in an operative condition in response to the second writing signal 7 from the microprogram sequencer 28.

with the above structure, if the transfer gate transistor $T_5$ is off, the data in the unitary register 8A is not supplied to the internal bus, can be fed through the inverter 1NO and the write buffer 12F to the same memory block. In other words, data can be transferred with the same memory block without the intermediary of the internal bus BUS.

Namely, in the case of inter-block data transfer, the unitary register 8A responds to the write signal 13 to hold the data read out of the memory block $M_1$. Therefore, without application of the read signal 14 to the transfer gate transistor $T_5$, the read signal 7 is applied to the write buffers 12F so that the data held in the unitary register 8A is written into the memory block $M_1$.

The data transfer between different memory block is executed similarly to the manner explained in connection with the FIG. 3 embodiment. Therefore, in this case, the transfer gate transistor $T_5$ is brought into on condition in response to the read signal 14.

Figure 7:
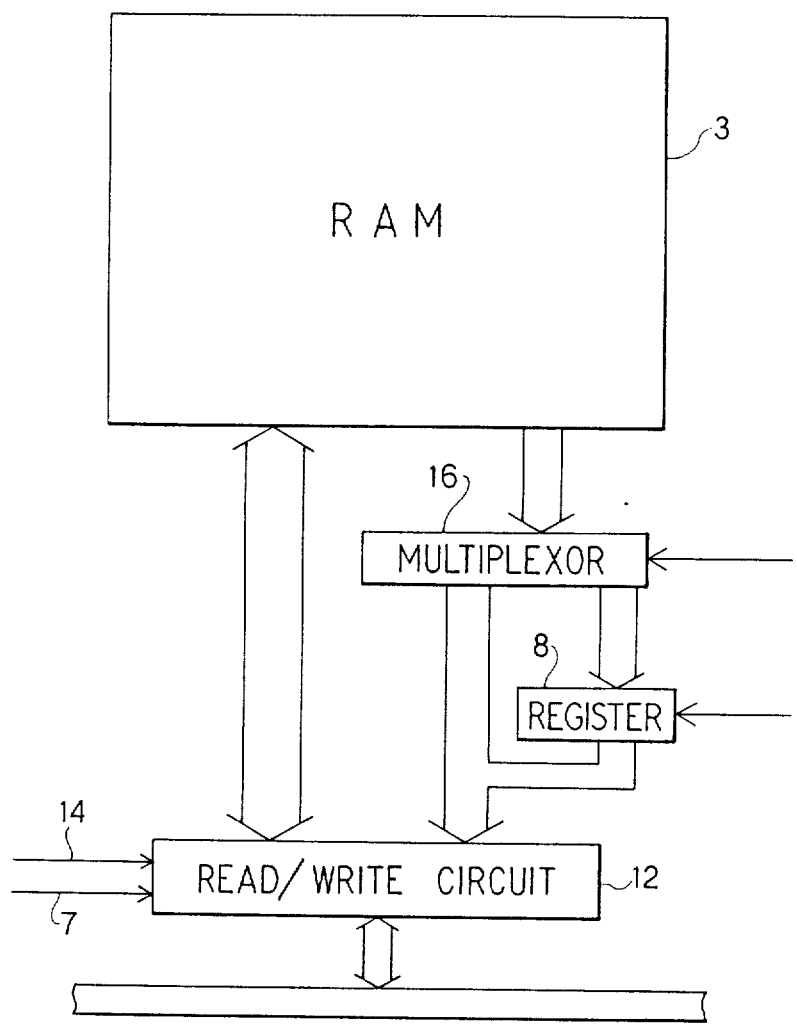
FIG. 7 is a view similar to FIG. 3 but showing another embodiment of the microcomputer in accordance with the present invention.

Referring to FIG. 7, there is shown another microcomputer in accordance with the present invention, in which elements similar to those shown in FIG. 3 are given the same Reference Numerals.

As will be apparent from comparison between FIGS. 3 and 7, the second embodiment has a multiplexor 16 having its input connected to the RAM 3. This multiplexor 16 has two outputs, one of which is connected to the input of the register, and the other output is connected to the input of read/write unit 12 in parallel the output of the register 8.

The microcomputer constructed as mentioned above operates in the following manner.

The multiplexor 16 is controlled by control signal 17 to couple its input, that is, the RAM 3 to the input of the register 8 in case that a data transfer inside the same RAM is executed. On the contrary, the multiplexor 16 connects the RAM 3 to the input of the read/write unit 12 in case of simply transferring a data in the RAM 3 to other units through the data bus 2. In this case, the read/write unit 12 reads a data through the multiplexor 16 from the RAM at the address designated by the read address signal through the address bus 5 and outputs the data onto the data bus 2 in response to the read signal 14.

In case of transferring a data within the RAM 3, the register 8 reads through the multiplexor 16 a data designated by the read address signal through the address bus 5 in response to the first write signal 13 from the CPU 1.

The CPU 1 sequentially supplies a write address signal 5 to the RAM 3. The read/write unit 12 reads the data stored in the register 8 and outputs the data onto the data bus 2 in response to the read signal 14. The same read/write unit 12 writes the data on the data bus 2 to the RAM 3 at the address designated by the write address signal 5 in response to the write signal 7 from the CPU 1.

The second embodiment of the microcomputer in accordance with the present invention includes a multiplexor as described above. The multiplexor connects the RAM directly to the read/write unit in case of simply transferring a data to other units using an internal bus. On the contrary, the multiplexor connects the RAM to the read/write unit through a register in case of transferring a data inside the same RAM.

As a result, it is possible to avoid a fall of the operation speed in executing a data transfer to other unit through the internal bus.

The invention has thus been shown and described with reference to specific embodiments. However, it should be noted that the invention is in no way limited to the details of the illustrated structures but changes and modifications may be made within the scope of the appended claims.

I claim:

1. A system for transferring data from a memory location to another memory location of a read/write memory comprising:

a plurality of memory blocks, each of the memory blocks having one input/output line means, comprising register means including a plurality of unitary registers provided one for each of the memory blocks, each of the unitary registers having an input connected to the input/output line means of the corresponding memory block for holding the data read out of the corresponding memory block, and read/write circuit means including a plurality of unitary read/write circuits provided one for each of the memory blocks, each of said unitary read/write circuits having an input connected to an output of the corresponding unitary register to read out the data held in the corresponding unitary register, a first output internally connected to the input/output line means of the associated memory block which is connected to the input of the corresponding unitary register, so as to write the read-out data directly to the associated memory block, and a second output connected to an internal data bus through a transfer gate which is brought into an on condition when data should be transferred from the memory to the internal data bus, whereby data can be transferred from one memory location of a given memory block to another memory location of the same memory block without the intermediary of the internal data bus while maintaining the transfer gate in an off condition.

2. A system as claimed in claim 1 wherein each of the unitary registers includes a first inverter having an input connected to the input/output line of the associated memory block through a second transfer gate which is brought into an on condition in response to a first write control signal, the first inverter having an output connected to the corresponding unitary read/write circuit, a second inverter connected at its input to the output of the first inverter, and a feedback transistor connected between an output of the second inverter and the input of the first inverter and having a gate connected to receive through another inverter the first write control signal, whereby the data is inputted to the register in response to the first write control signal and the data is retained in the register after completion of the first write control signal.

3. A microcomputer claimed in claim 2 wherein each of the unitary read/write circuits further includes a third inverter having an input connected to the output of the first inverter of the corresponding unitary register and an output through the first named transfer gate to the internal data bus, and a write buffer connected at its input to the output of the third inverter and at its output to the input/output line of the associated memory block, the write buffer being adapted to be put in an operative condition in response to a second writing control signal.

4. A microcomputer comprising a central processing unit, an internal data bus coupled to the central processing unit, a read-write memory having a plurality of memory locations and adapted such that data can be both read from and written into a memory location designated by an address given by the central processing unit, the read/write memory including a plurality of memory blocks, each of the memory blocks having one input/output line, a register directly coupled to the memory and controlled by the central processing unit for holding the data read out of the memory, and a read/write circuit having a first input connected to the register, a first output connected to the memory and a second input/output connected to the internal data bus, the read/write circuit being controlled by the central processing unit for transferring the data held in the register to the internal data bus and then to the memory from the internal data bus, wherein the register includes a plurality of unitary registers provided one for each of the memory blocks, each of the unitary registers having an input connected to the input/output line of the corresponding memory block, and wherein the read/write circuit includes a plurality of unitary read/write circuit provides one for each of the memory blocks, each of the unitary read/write circuits having an input connected to an output of the corresponding unitary register, a first output internally coupled to the input of the corresponding register which is connected to the input/output line of the same memory block, and a second output connected to an internal data bus through a transfer gate which is brought into an on condition in response to the read signal from the central processing unit, so that data can be transferred from one memory location to a given memory block to another memory location of the same memory block without the intermediary of the internal data bus while maintaining the transfer gate in an off condition.

5. A microcomputer comprising:

a central processing unit, an internal data bus coupled to the central processing unit, a random access memory having a plurality of memory locations and adapted such that data can be both read from and written into a memory location designated by an address given by the central processing unit, the read/write memory including a plurality of memory blocks, each of the memory blocks having one input/output line, a register directly coupled to the memory and controlled by the central processing unit for holding the data read out of the memory, and a read/write circuit having a first input connected to the register, a first output connected to the memory and a second input/output connected to the internal data bus, the read/write circuit being controlled by the central processing unit for transferring the data held in the register to the internal data bus and then to the memory from the internal data bus, wherein the register includes a plurality of unitary registers provided one for each of the memory blocks, each of the unitary registers having an input connected to the input/output line of the corresponding memory blocks, said read/write circuit includes a plurality of unitary read/write circuits provided one for each of the memory blocks, each of the unitary read/write circuits having an input connected to an output of the corresponding unitary register, a first output internally coupled to the input of the corresponding unitary register which is connected to the input/output line of the same memory block, and a second output connected to the internal data bus through a transfer gate, said central processing unit being adapted to supply a read address signal to the random access memory and a first write signal to each unitary register so that the data at a memory location in the random access memory designated by the read address signal is written into the unitary registers, the central processing unit then operating to supply a read signal to the transfer gate of each read/write circuit so as to bring the transfer gate into an on condition so that the data held in each unitary register is read out by the corresponding read/write circuit and outputted to the internal data bus, and the central processing unit supplying a write address signal to the random access memory and a second write signal to the read/write circuit while the read signal is supplied to the read/write circuit, so that the data held in the unitary register is written into a memory location designated signal by the write address by the action of the read/write circuit, whereby so that data can be transferred from one memory location of a given memory block to another memory location of the same memory block without the intermediary of the internal data bus; and wherein each of the unitary registers includes a first inverter having an input connected to the common input/output line of the associated memory block through a second transfer gate transistor whose gate is connected to receive the first write signal from the central processing unit, the first inverter having an output connected to the corresponding unitary read/write circuit, a second inverter connected at an input to the output of the first inverter, and a feedback transistor connected between an output of the second inverter and the input of the first inverter and having a gate connected to receive through another inverter the first write signal from the central processing unit, whereby the data is retained in the unitary register immediately after the data is inputted to the unitary register in response to the first write signal.

6. A microcomputer claimed in claim 5 wherein each of the unitary read/write circuits further includes a third inverter having an input connected to the output of the first inverter of the corresponding unitary register and an output through the first mentioned transfer gate to the internal data bus, and a write buffer connected at its input to the output of the third inverter and at its output to the common input/output line of the associated memory block, the write buffer being adapted to be put in an operative condition in response to the second writing signal from the central processing unit.

7. A microcomputer claimed in claim 6 wherein each of the memory block includes a plurality of word lines selectively driven by a Y-decoder, a plurality of data lines intersecting the word lines and connected through an Xselector to the common input/output lines, and a number of memory cells respectively located at intersections between the words lines and the data lines so as to form a memory cell matrix, each of the memory cells being connected between one of the word lines and one of the data lines.

8. A microcomputer comprising:

a central processing unit for generating a first write control signal during a read address generation period and generating during a write address generation period a read control signal and a second write control signal delayed from the read control signal, an internal data bus coupled to the central processing unit, a read-write memory having a plurality of memory blocks, each of the memory blocks having one input/output line, the read/write memory being adapted such that data can be both read from and written into a memory location designated by an address given by the central processing unit, a register directly coupled to each one of the memory blocks of the memory and responding to the first write control signal from the central processing unit for holding the data read out of the associated memory block at a location designated by a read address, and a read/write circuit provided for each one of the memory blocks, each read/write circuit having a first input connected to a corresponding register, a first output connected to a corresponding memory block and a second input/output connected to the internal data bus, the read/write circuit being in response to the read control signal from the central processing unit for transferring the data held in the register to the internal data bus and also responding to the second write control signal for writing the data held in the register into the memory at a location designated by a write address, wherein said second input/output of the read/write circuit is connected to the internal data bus through a first transfer gate transistor whose gate is connected to receive the read control signal from the central processing unit so that the first transfer gate transistor is brought into an on condition in response to the read control signal from the central processing unit.

9. A microcomputer claimed in claim 8 wherein each of the registers includes a first inverter having an input connected to the common input/output line of the associated memory block through a second transfer gate transistor whose gate is connected to receive the first write control signal from the central processing unit, the first inverter having an output connected to the corresponding read/write circuit, a second inverter connected at its input to the output of the first inverter, and a feedback transistor connected between an output of the second inverter and the input of the first inverter and having a gate connected to receive through another inverter the first write control signal from the central processing unit, whereby the data is inputted to the register in response to the first write control signal and the data is retained in the register after completion of the first write control signal.

10. A microcomputer claimed in claim 9 wherein each of the read/write circuits further includes a third inverter having an input connected to the output of the first inverter of the corresponding register and an output through the first transfer gate transistor to the internal data bus, and a write buffer connected at its input to the output of the third inverter and at its output to the input/output line of the associated memory block, the write buffer being adapted to be put in an operative condition in response to the second writing control signal from the central processing unit.

11. A microcomputer claimed in claim 10 wherein each of the memory block includes a plurality of word lines selectively driven by a Y-decoder, a plurality of data lines intersecting the word lines and connected through an X-selector to the input/output lines, and a number of memory cells respectively located at intersections between the word lines and the data lines so as to form a memory cell matrix, each of the memory cells being connected between one of the word lines and one of the data lines.

* * * * *